US008040715B2

(12) United States Patent
Takase

(10) Patent No.: US 8,040,715 B2
(45) Date of Patent: Oct. 18, 2011

(54) SEMICONDUCTOR STORAGE DEVICE

(75) Inventor: Satoru Takase, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 189 days.

(21) Appl. No.: 12/609,617

(22) Filed: Oct. 30, 2009

(65) Prior Publication Data
US 2010/0124097 A1 May 20, 2010

(30) Foreign Application Priority Data
Nov. 20, 2008 (JP) ................................ 2008-296378

(51) Int. Cl.
*G11C 11/00* (2006.01)
(52) U.S. Cl. ........................................ 365/148; 365/163
(58) Field of Classification Search .................. 365/148, 365/163, 230.03
See application file for complete search history.

(56) References Cited

U.S. PATENT DOCUMENTS
7,535,748 B2 *  5/2009  Shirahama et al. ........... 365/148
7,606,059 B2 * 10/2009  Toda ............................. 365/148
7,623,370 B2 * 11/2009  Toda et al. .................... 365/163
2010/0265757 A1 * 10/2010  Otsuka .......................... 365/148

FOREIGN PATENT DOCUMENTS
JP            2005-522045           7/2005
WO        WO 03/085675 A2      10/2003

* cited by examiner

*Primary Examiner* — Anh Phung
(74) *Attorney, Agent, or Firm* — Oblon, Spivak, McClelland, Maier & Neustadt, L.L.P.

(57) ABSTRACT

Plural memory cell arrays laminated on the semiconductor substrate each includes a plurality of first wirings and second wirings formed to intersect with each other. The control circuit provides, in a non-selected second memory cell array that shares the first wiring with a selected first memory cell array, and a non-selected third memory cell array located more distant from the first memory cell array than the second memory cell array, the first potential to all of the first wirings and all of the second wirings. It also provides, in a non-selected fourth memory cell array that shares the second wiring with the first memory cell array and a non-selected fifth memory cell array located more distant from the first memory cell array than the fourth memory cell array, the second potential to all of the first wirings and all of the second wirings.

16 Claims, 12 Drawing Sheets

Row decoder 10

Main Row decoder 11

WDRV Driver 12

VRow Driver 13

Column Switch 20

Column decoder 21

Sense Amp & Write Buffer 22

VCol Driver 23

{ (H) ··· "H" ONLY IN SELECTED LINE, "L" IN OTHERS
(L) ··· "L" ONLY IN SELECTED LINE, "H" IN OTHERS
H ··· ALL "H"
L ··· ALL "L"

US 8,040,715 B2

SEMICONDUCTOR STORAGE DEVICE

CROSS REFERENCE TO RELATED APPLICATIONS

This application is based on and claims the benefit of priority from prior Japanese Patent Application No. 2008-296378, filed on Nov. 20, 2008, the entire contents of which are incorporated herein by reference.

BACKGROUND OF THE INVENTION

1. Field of the Invention

The present invention relates to a semiconductor storage device.

2. Description of the Related Art

In recent years, an attention is paid to resistance change memories as subsequent candidates of flash memories. The resistive memory devices include narrowly-defined Resistive RAM (ReRAM) and Phase Change RAM (PCRAM). The Resistive RAM store resistance states in a nonvolatile manner with transition metal oxide being used as a recording layer. The Phase Change RAM use chalcogenide as a recording layer and utilize resistance information of crystalline state (conductor) and amorphous state (insulator).

Variable resistance elements of the resistive memories have two kinds of operating modes. One of them is called a bipolar type such that polarity of an applied voltage is switched and thus a high resistant state and a low resistant state are set. The other one is called as a unipolar type such that a voltage value and voltage applying time are controlled without switching the polarity of an applied voltage, and thus the high resistant state and the low resistant state can be set.

In order to realize high-density memory cell arrays, the unipolar type is preferable. This is because that the unipolar type solution enables, without transistors, cell arrays to be configured by superposing variable resistance elements and rectifier elements, such as diodes, on respective intersections between bit lines and word lines. Moreover, large capacity may be achieved without an increase in cell array area by arranging such memory cell arrays laminated in a three-dimensional manner.

Japanese Unexamined Patent Publication No. 2005-522045 describes a phase change memory with a three-dimensional memory cell, array structure in which memory cell arrays are laminated on a semiconductor substrate. In such a phase change memory device, a current flows through a selected memory cell when a bit line connected to the selected memory cell is controlled to switch from "H" level to "L" level, and a word line connected to the selected memory cell is controlled to switch from "L" level to "H" level. Write/read of the binary data is performed by detecting the current.

Most of the non-selected memory cells on the memory cell array, however, are connected to a word line and bit line different from those connected to the selected memory cell, and applied with a reverse-biased voltage, respectively. When a reverse-biased voltage is applied to a diode included in the memory cell, a leak current flows therethrough.

In addition, when plural memory cell arrays are laminated, and one of the memory cell arrays is selected therefrom, similar reverse-biased voltage may be applied to many memory cells included in non-selected memory cell arrays. This also may increase the amount of the leak current.

SUMMARY OF THE INVENTION

A semiconductor storage device according to one aspect of the present invention comprises: a semiconductor substrate; a plurality of memory cell arrays laminated on the semiconductor substrate, each of the memory cell arrays including a plurality of first wirings and a plurality of second wirings formed to intersect with each other. Each of the memory cells is arranged at respective intersections between the first wirings and the second wirings, each of the memory cells including a rectifier element and a variable resistance element connected in series. A control circuit is operative to selectively drive the first and second wirings. The first and second wirings are shared by two of the memory cell arrays located adjacent to each other in a lamination direction. The control circuit is operative to provide, in a first memory cell array selected from among the plurality of the memory cell arrays, a first potential to a selected first wiring, a first standard potential that is lower than the first potential to a non-selected first wiring, a second potential that is lower than the first potential to a selected second wiring, and a second standard potential that is higher than the second potential to a non-selected second wiring. The control circuit is operative to provide, in a non-selected second memory cell array that shares the first wiring with the first memory cell array and a non-selected third memory cell array located more distant from the first memory cell array than the second memory cell array, the first potential to all of the first wirings and all of the second wirings. The control circuit is operative to provide, in a non-selected fourth memory cell array that shares the second wiring with the first memory cell array and a non-selected fifth memory cell array located more distant from the first memory cell array than the fourth memory cell array, the second potential to all of the first wirings and all of the second wirings.

DETAILED DESCRIPTION OF THE EMBODIMENTS

Embodiments of the present invention will now be described below with reference to the accompanying drawings.

In the disclosed embodiments, a semiconductor storage device is described as a resistive memory device having a three-dimensional memory cell array structure with laminated memory cell arrays. Of course, this configuration, however, is intended to be exemplary only, and not a limitation upon the present invention.

First Embodiment

Figure 1:
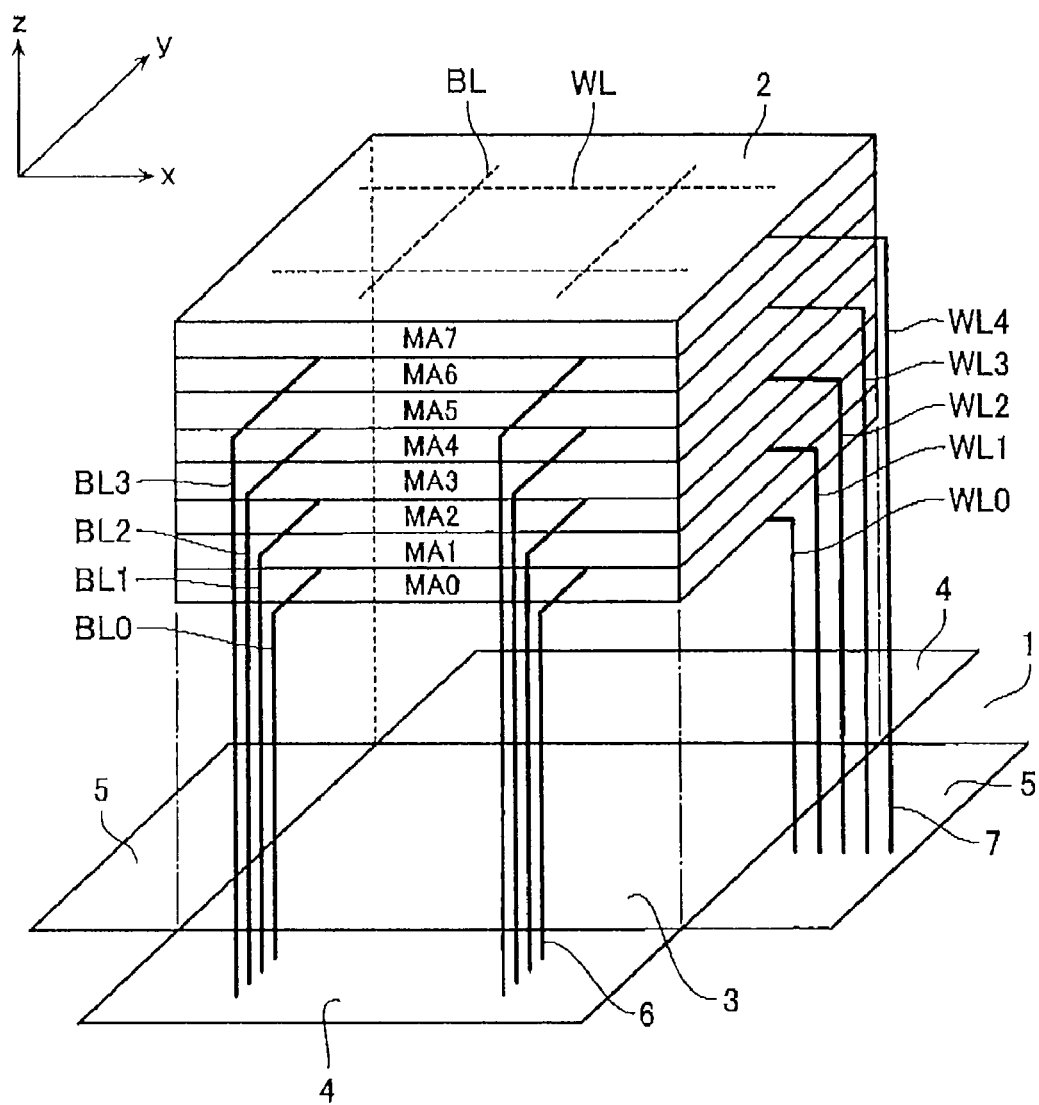
FIG. 1 is a perspective view illustrating a configuration of a resistive memory device according to a first embodiment of the present invention.

FIG. 1 illustrates a basic configuration of a resistive memory device according to an embodiment of the present invention, i.e., configuration of a wiring region 3, in which wirings such as global buses are formed on a semiconductor substrate 1, and a memory block 2 laminated thereon.

In the case of FIG. 1, the memory block 2 includes eight layers of memory cell arrays MA0 to MA7.

The wiring region 3 is provided on the semiconductor substrate 1 immediately below the memory block 2. The wiring region 3 has, for example, global buses provided thereon for communicating data written to and read from the memory block 2 with the external. As described below, a column control circuit including a column switch, etc., and a row control circuit including a row decoder, etc., may also be provided on the wiring region 3.

It is necessary to provide vertical wirings (via contacts) on the side surface of the memory block 2 for connecting word lines WL and bit lines, BL of the laminated memory cell arrays MA to the wiring region 3 formed on the semiconductor substrate 1. The wiring region 3 has bit-line contact regions 4 and word-line contact regions 5 provided on its four sides. The bit-line contact regions 4 and the word-line contact regions 5 have bit-line contacts 6 and word-line contacts 7 formed therein for connecting the bit lines BL and the word lines WL to the control circuits. Each of the word lines WL is connected to the wiring region 3 via a respective word-line contact 7, one end of which is formed on one of the word-line contact regions 5. In addition, each of the bit lines BL is connected to the wiring region 3 via a respective bit-line contact 6, one end of which is formed on one of the bit-line contact regions 4.

Although FIG. 1 illustrates one memory block 2 with multiple memory cell arrays MA laminated therein in a direction perpendicular to the semiconductor substrate 1 (the z direction of FIG. 1), a plurality of such memory blocks 2 are, in fact, arranged in a matrix form in a longitudinal direction to the word lines WL (the x direction of FIG. 1) as well as in another longitudinal direction to the bit lines BL (the y direction of FIG. 1).

As illustrated in FIG. 1, in the one word-line contact region 5 according to this embodiment, the word lines WL in each layer are connected to the wiring region 3 via any one of five columns of contacts, each of which is separately prepared for each layer. In addition, in the one bit-line contact region 4, the bit lines BL in each layer are connected to the wiring region 3 via any one of four columns of contacts, each of which is separately prepared for each layer.

Although the bit lines BL are independently driven for each layer and the word lines WL are also independently driven for each layer in this embodiment, the present invention is not limited to this embodiment. As long as the following operation is possible, part of the bit lines BL or the word lines WL may also be connected to a single contact in common.

Figure 2:
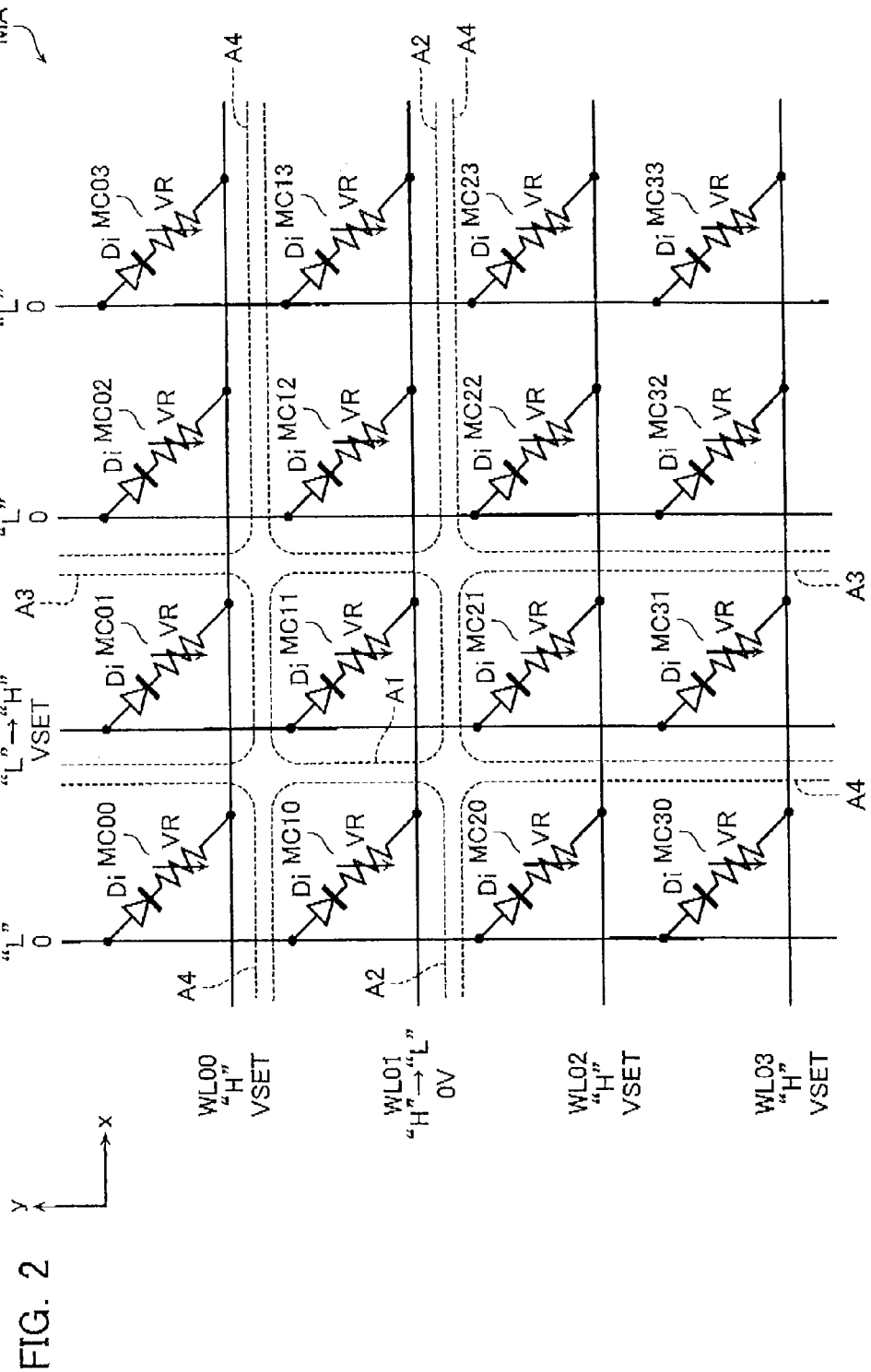
FIG. 2 is an equivalent circuit diagram of a memory cell array in the resistive memory device according to the first embodiment.

FIG. 2 is an equivalent circuit diagram of a memory cell array MA in the resistive memory device. In this case, the memory cell array MA illustrated in FIG. 2 has, for example, $1*10^3$ pieces of memory cells MC along a longitudinal direction of the word lines WL (the x direction of FIG. 2), as well as along a longitudinal direction of the bit lines BL (the y direction of FIG. 2), respectively. In the memory cell array MA, the unit memory cells are arranged in a two dimensional matrix form. As can be seen, resistance-varying type unit memory cells MC are positioned at intersections between word lines WL and bit lines BL, with rectifier elements, e.g., diodes Di, and variable resistance elements VR connected in series. It should be noted that the arrangement and polarity of the diodes Di and the variable resistance elements VR included in the memory cells MC are not limited to the illustrated ones.

The variable resistance elements VR, which have, for example, a structure of electrode/transition metal oxide/electrode, provide a change in resistance value of metal oxide depending on the conditions of applied voltage, current, heat, etc., and store the different states of the resistance values as information in a non-volatile manner. More specifically, the following can be used as the variable resistance elements VR: changing resistance values with a phase transition between a crystalline state and an amorphous state, such as chalcogenide (PCRAM); changing resistance values by depositing metal cations to form a contacting bridge between electrodes, or ionizing the deposited metal to break down the contacting bridge (CBRAM: Conductive Bridging RAM); changing resistance values through application of voltage or current (ReRAM) (which is divided broadly into two types: one is the type where a resistance change occurs depending on the absence of presence of charges trapped by a charge trapping residing on the electrode interface; and the other is the type where a resistance change occurs depending on the absence or presence of a conductive path due to oxygen defect, etc.); and so on.

For unipolar-type ReRAM, data is written to a memory cell MC by applying, for on the order of 10 ns to 100 ns, a voltage of, e.g., 3.5V (in fact, on the order of 4.5V if a voltage drop in the corresponding diode Di is included) and a current of on the order of 10 nA to a variable resistance element VR. As a result, the variable resistance element VR changes from a high resistance state to a low resistance state. The operation of changing the variable resistance element VR from the high resistance state to the low resistance state is hereinafter referred to as the "set operation".

The variable resistance element VR in its low resistance state after the set operation is applied, for on the order of 500 ns to 2 μs, a voltage of 0.8V (in fact, on the order of 1.8V if a voltage drop in the corresponding diode Di is included) and a current of on the order of 1 μA to 10 μA. As a result, the variable resistance element VR changes from the low resistance state to the high resistance state. The operation of changing the variable resistance element VR from the low resistance state to the high resistance state is hereinafter referred to as the "reset operation".

For example, a memory cell MC takes the high resistance state as a stable state (reset state) and data is written to each memory cell MC by such a set operation that causes a reset state to be switched to the low resistance state for binary storage.

A read operation from the memory cell MC is performed by applying a voltage of 0.4V (in fact, on the order of 1.4V if a voltage drop in the corresponding diode Di is included) to the variable resistance element VR and monitoring a current flowing through the variable resistance element VR. As a result, it is determined whether the variable resistance element VR is in its low resistance or high resistance state.

FIG. 2 illustrates the states of voltage applied to the bit lines BL and the word lines WL connected to a memory cell array MA in a set operation of the memory cell MC. In this case, it is assumed that a selected memory cell MC to which data is to be written by the set operation is MC11.

Non-selected bit lines BL00, BL02 and BL03 which are not connected to the selected memory cell MC11 are in the "L" state (0 V). In the set operation, a selected bit line BL01 connected to the selected memory cell MC11 is driven from the "L" state into the "H" state (a voltage VSET). The non-selected word lines WL00, WL02 and WL03 which are not connected to the selected memory cell MC11 are in the "H" state (the voltage VSET). In the set operation, the selected word line WL01 connected to the selected memory cell MC11 is driven from the "H" state (the voltage VSET) into the "L" state (0 V). As a result, a diode Di of the selected memory cell MC11 is turned to a forward bias state, which causes current to flow therethrough. As a result, the variable resistance element VR of the selected memory cell MC11 is changed from a high resistant state into a low resistant state, so that the set operation is completed.

In FIG. 2, memory cells MC connected at intersections between the selected word line WL01 and the non-select bit lines BL00, BL02, and BL3, which are surrounded by a broken line A2 in FIG. 2, are hereinafter called "a half-selection state". The memory cells MC in the half selection state is not provided with a voltage even in the set operation. Likewise, memory cells MC connected at intersections between the select bit lines BL01 and the non-selected word lines WL00, WL02 and WL03, which are surrounded by a broken line A3 in FIG. 2 are in the half selection state.

In addition, memory cells MC connected at intersections between the non-selected word line WL00, WL02 and WL03 and the non-select bit lines BL00, BL02, and BL3, which are surrounded by a broken line A4 in FIG. 2, are hereinafter called "a non-selection state". In the memory cell MC in the non-selected state, a reverse bias voltage is applied to the diode Di from the word line WL (the voltage VSET) and the bit line BL (a voltage of 0 V). Accordingly, a leak current flows through the non-selected memory cell MC.

Figure 3:
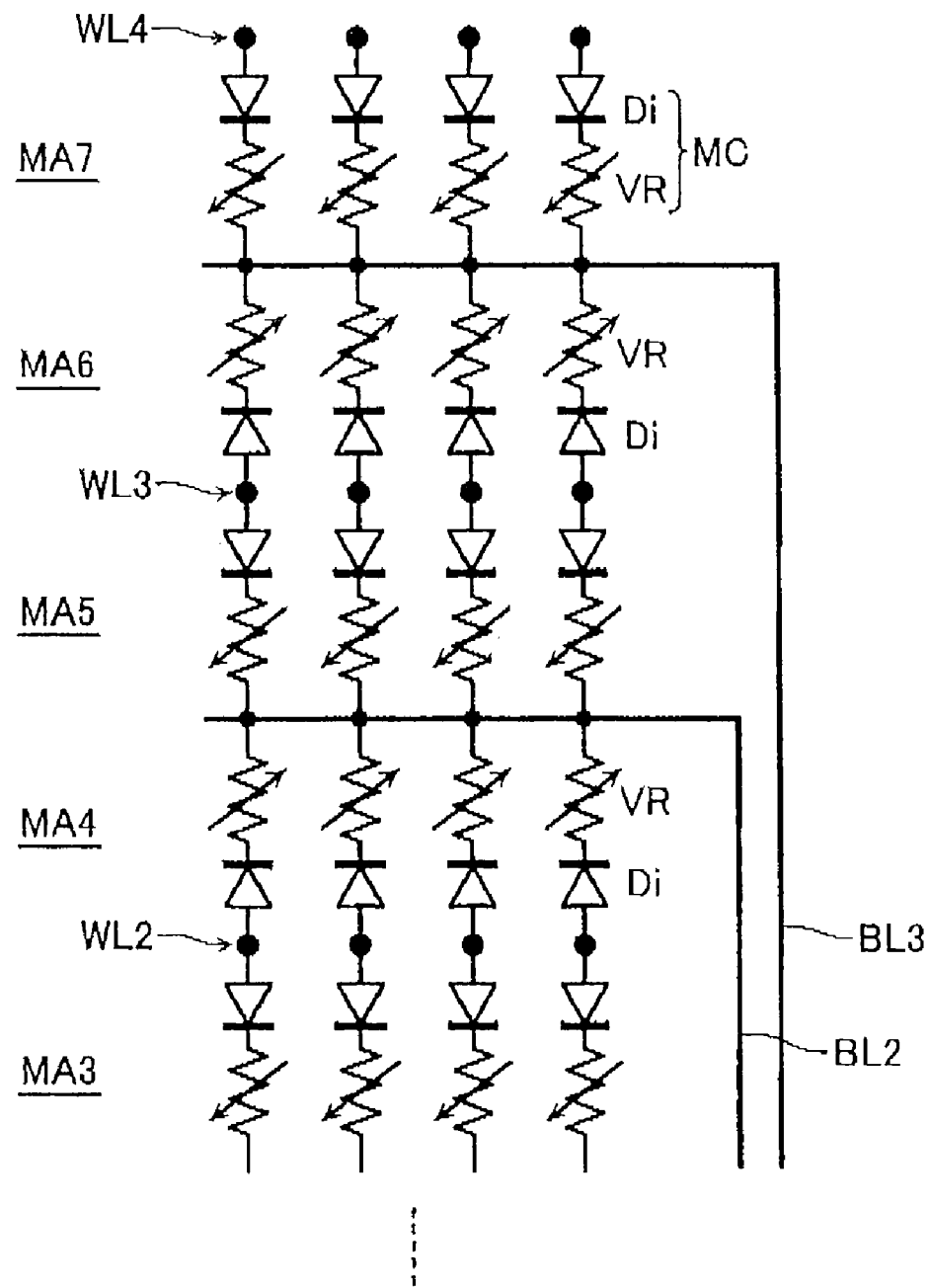
FIG. 3 is a sectional view of the memory cell block 2 in x-z plane.
Figure 4:
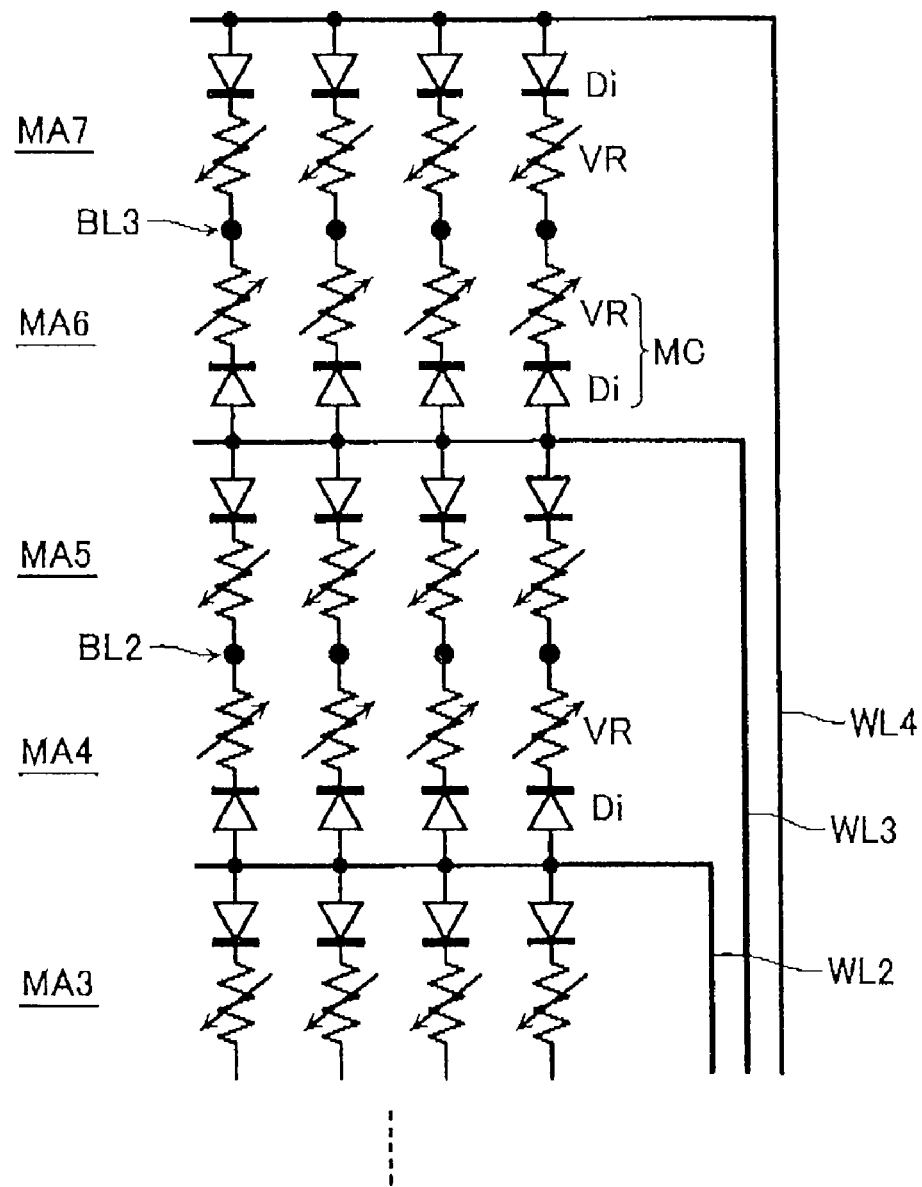
FIG. 4 is a sectional view of the memory cell block 2 in y-z plane.

As shown in FIGS. 3 and 4, each memory cell array MA shares the word lines WL and/or the bit lines BL with other memory cell arrays MA which are adjacent in a stacking direction. Odd-numbered memory cell arrays MA1, MA3, MA5, and MA7 includes the word lines WL1-WL4 arranged on the upper part thereof, and bit lines BL0-BL3 arranged on the lower part thereof. The memory cells MC are arranged at the intersections of the word lines WL and the bit lines BL. In addition, each of the odd-numbered memory cell arrays shares their word lines WL with another memory cell array MA located on the upper layer, while shares their but lines BL with another memory cell array MA located on the lower layer.

On the other hand, even-numbered memory cell arrays MA0, MA2, MA4, and MA6 includes the bit lines BL0-BL3 arranged on the upper part thereof, and word lines WL1-WL4 arranged on the lower part thereof. The memory cells MC are arranged at the intersections of the word lines WL and the bit lines BL. In addition, each of the even-numbered memory cell arrays shares their word lines WL with another memory cell array MA located on the lower layer, while shares their but lines BL with another memory cell array MA located on the upper layer.

In both the odd-numbered memory cell arrays MA and the even-numbered memory cell arrays MA, an anode of the diode Di is connected to the bit line BL side, and a cathode of the diode Di is connected to the word line WL side. Thus, when the voltage of the bit line BL is larger than the voltage of the word line WL by a certain value, and thereby a forward bias voltage is applied to the memory cell arranged at the intersection, the set operation is performed on the memory cell MC at the intersection.

[Configuration of Control Circuit]

Figure 5:
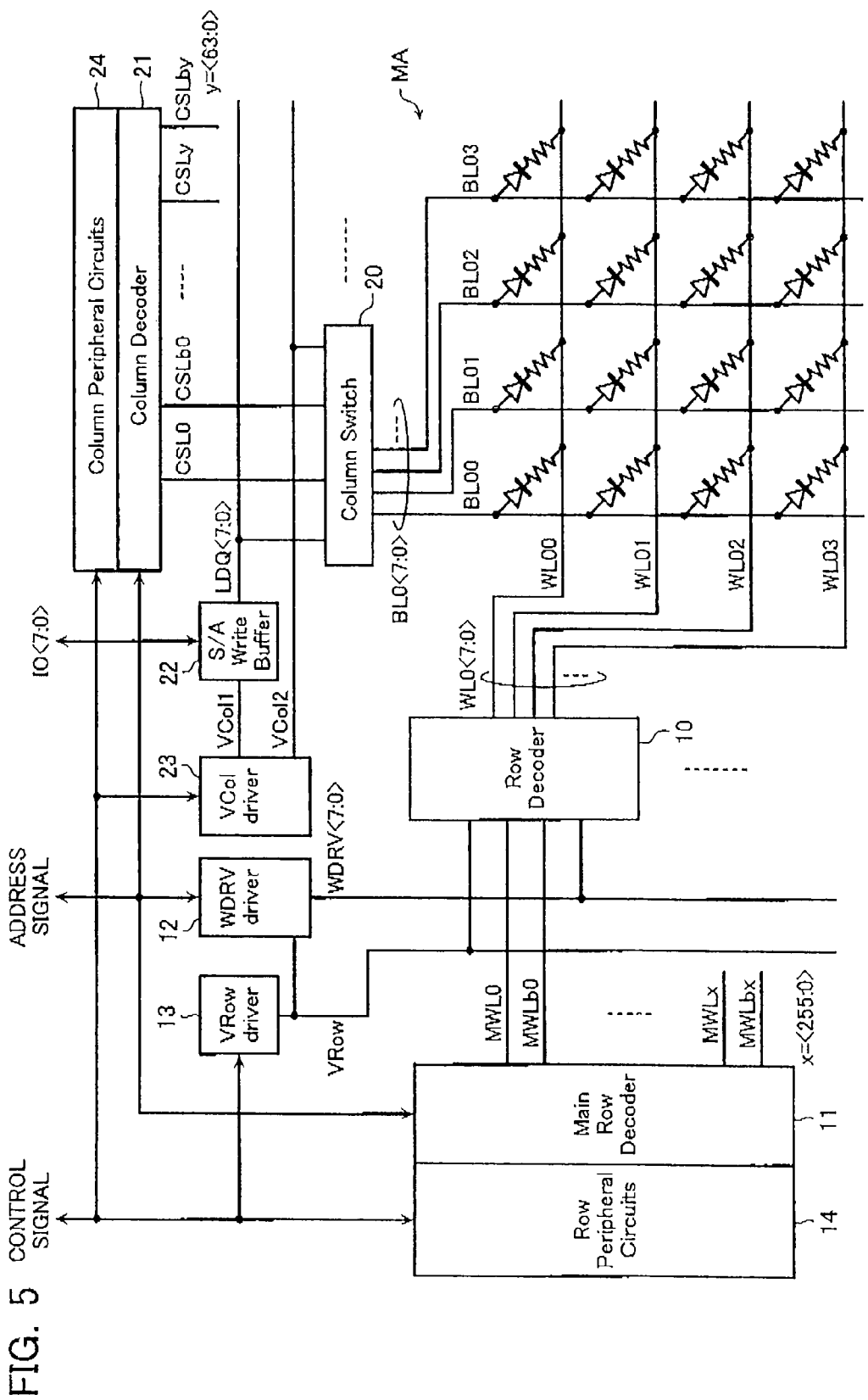
FIG. 5 is a block diagram illustrating an arrangement example of column/row control circuits of the resistive memory device according to the first embodiment.

Next, a configuration of a column control circuit and a row control circuit which applies the above described voltages to the bit line BL and the word line WL will be described. In this embodiment, a case where 1M-bit memory cells MC are arranged in the one memory cell array MA is explained, by way of example. Specifically, in the memory cell array MA, 2K-bit (2048) unit memory cells MC are arranged in the longitudinal direction of the bit line BL, and 512-bit unit memory cells MC are arranged in the longitudinal direction of the word line WL in this example. FIG. 5 is a block diagram illustrating an example of arrangement of the column control circuit and the row control circuit in the resistive memory device.

Referring to FIG. 5, the row control circuit includes a row decoder 10, a main row decoder 11, a write drive line driver 12, a row power supply line driver 13, and a row-system peripheral circuit 14. The column control circuit includes a column switch 20, a column decoder 21, a sense amplifier/write buffer 22, a column power supply line driver 23, and a column-system peripheral circuit 24.

The word line WL of the embodiment has a hierarchical structure, and the main row decoder 11 selectively drives one of 256 pairs of main word lines MWLx and MWLbx (x=<255:0>). For example, in the selected main word lines MWLx and MWLbx, the main word line MWLx becomes the "H" state, while the main word line MWLbx becomes the "L" state.

In contrast, in the non-selected main word lines MWLx and MWLbx, the main word line MWLx becomes the "L" state and the main word line MWLbx becomes the "H" state. One pair of main word lines MWLx and MWLbx is connected to one row decoder 10. The row decoder 10 selectively drives one of eight word lines WL included in the word lines WLx<7:0>. The word lines WLx<7:0> is located under the hierarchy of the main word lines MWLx and MWLbx. The row decoder 10 connected to the main word lines MWLx and MWLbx selectively driven by the main row decoder 11 further selectively drives the word line WL, thereby selectively driving one word line WL. Eight write drive lines WDRV<7:0> and row power supply line VRow are connected to the write drive line driver 12, and the row power supply line VRow is connected to the row power supply line driver 13. The voltage (VSET) is applied to the row power supply line VRow. The voltage (VSET) is supplied to the word line WL under the hierarchy of the non-selected main word line MWL and MWLbx, and the non-selected word line WL under the hierarchy of the selected main word line MWL and MWLbx.

The write drive lines WDRV<7:0> and the row power supply line VRow are connected to the row decoder 10. The voltage is applied to the write drive line WDRV<7:0> and the row power supply line VRow in order that the row decoder 10 drives the word line WL. Specifically, during the set operation, the voltage Vss (=0 V) is supplied to one write drive line WDRV corresponding to the selected word line WL in the eight write drive lines WDRV<7:0>, and the voltage VSET is supplied to other seven write drive lines WDRV of the write drive lines WDRV<7:0>. The row-system peripheral circuit 14 manages the whole of the resistive memory device. The row-system peripheral circuit 14 receives a control signal from an external host device, the row-system peripheral circuit 14 reads, write, and erases the data, and the row-system peripheral circuit 14 performs data input and output management.

The bit line BL of the embodiment also has the hierarchical structure, and the column decoder 21 selectively drives one pair of 64 pairs of column selection lines CSLy and CSLby (y=<63:0>). For example, regarding the selected column selection lines CSLy and CSLby, the column selection line CSLy becomes the "H" state, while the column selection line CSLby becomes the "L" state. In contrast, regarding the non-selected column selection lines CSLy and CSLby, the column selection line CSLy becomes the "L" state, while the column selection line CSLby becomes the "H" state. One pair of the column selection lines CSLy and CSLby is connected to one column switch 20. The column switch 20 selectively drives one of eight bit lines BLy<7:0> arranged under the hierarchy of the column selection lines CSLy and CSLby.

The column switch 20 connected to the column selection lines CSLy CSLby selectively driven by the column decoder 21 further selectively drives the bit line BL, thereby selectively driving one bit line BL. The sense amplifier/write buffer 22 detects and amplifies signals read on the local data lines LDQ<7:0>, and the sense amplifier/write buffer 22 supplies the write data fed from data input and output lines 10<7:0> to the memory cell MC through the column switch 20.

The sense amplifier/write buffer 22 is connected to eight local data lines LDQ<7:0> and a column power supply lines Vcol1 and Vcol2. The column power supply line driver 23 is connected to the column power supply lines VCol1.

The local data lines LDQ<7:0> and the column power supply line Vcol2 are connected to the column switch 20. The voltage is applied to the local data line LDQ<7:0> in order that the column switch 20 drives the bit line BL. Specifically, the voltage VSET is supplied to one of eight local data lines LDQ<7:0> corresponding to the selected bit line BL in the set operation, and voltage Vss=0 V is supplied to remaining seven local data lines LDQ<7:0>. The column-system peripheral circuit 24 manages the whole of the resistive memory device. The column-system peripheral circuit 24 receives a control signal from an external host apparatus, the column-system peripheral circuit 24 reads, write, and erases the data, and the column-system peripheral circuit 24 performs data input and output management.

The detailed configuration of the row control circuit will be described with reference to FIGS. 6 to 9. FIGS. 6 to 9 are circuit diagrams illustrating an example of the configuration of the row control circuit in the resistive memory device.

[Configuration of Row Decoder 10]

Figure 6:
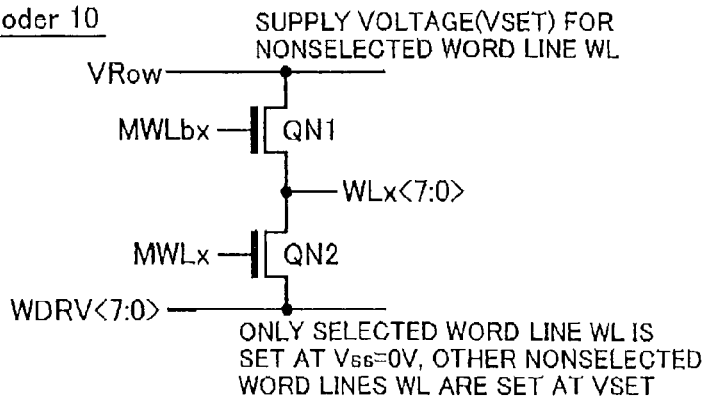
FIG. 6 is a circuit diagram illustrating an example configuration of the row control circuit of the resistive memory device according to the first embodiment.

As illustrated in FIGS. 5 and 6, one of the 256 pairs of main word lines MWLx and MWLbx (x=<255:0>), the row power supply line VRow, and the write drive lines WDRV<7:0> are connected to the row decoder 10. The word lines WLx<7:0> are connected to the row decoder 10, and each of the word lines WLx<7:0> is connected to the plural memory cells MC that are arrayed in line. As described above, the word lines WLx<7:0> connected to the one row decoder 10 includes the eight wirings of word line WLx0 to word line WLx7. Similarly, the write drive lines WDRV<7:0> are the eight wirings WDRV0 to WDRV7.

As illustrated in FIG. 6, the row decoder 10 includes eight transistor pairs in each of which sources of two NMOS transistors QN1 and QN2 are connected to each other. The main word line MWLbx is connected to a gate of the transistor QN1 and the row power supply line VRow is connected to the drain of the transistor QN1. The main word line MWLx is connected to the gate of the transistor QN2 and one of the write drive lines WDRV<7:0> is connected to the drain of the transistor QN2. The sources of the transistors QN1 and QN2 are connected to one of the word lines WL included in the word lines WLx<7:0>.

[Configuration of Main Row Decoder 11]

Figure 7:
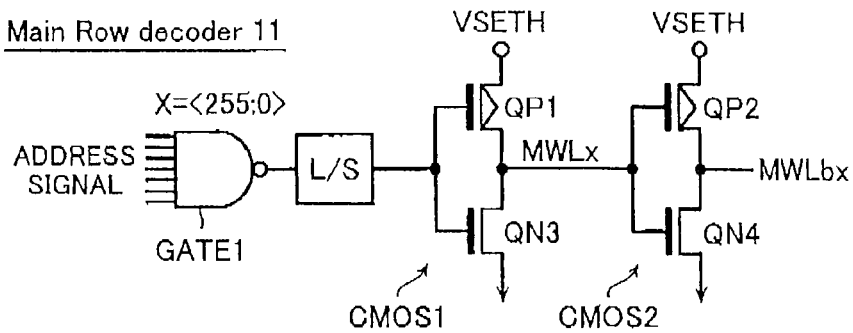
FIG. 7 is a circuit diagram illustrating an example configuration of the row control circuit of the resistive memory device according to the first embodiment.

As illustrated in FIGS. 5 and 7, 256 pairs of main word lines MWLx and MWLbx (x=<255:0>) and an address signal line are connected to the main row decoder 11. The word line WL of the resistive memory device of the embodiment has the hierarchical structure. The main row decoder 11 is a pre-decoder. One set of main word lines MWLx and MWLbx is connected to eight transistor-pairs (QN1 and QN2 of FIG. 6) in one row decoder 10, and one row decoder 10 can select one of the eight word lines WLx<7:0>. The main row decoder 11 includes a circuit of FIG. 7 in each pair of the main word lines MWLx and MWLbx.

As illustrated in FIG. 7, in one main row decoder 11, the address signal line connected to the main row decoder 11 is connected to a logic gate GATE1. An output signal of the logic gate GATE1 is supplied to an input terminal of a CMOS inverter CMOS1 through a level shifter L/S. The CMOS inverter CMOS1 includes a PMOS transistor QP1 and an NMOS transistor QN3. A power supply VSETH is connected to the source of the transistor QP1, and the source of the transistor QN3 is grounded. The drains of the transistors QP1 and QN3 are connected to the main word line MWLx.

The main word line MWLx is connected to a CMOS inverter CMOS2. The CMOS inverter CMOS2 includes a PMOS transistor QP2 and an NMOS transistor QN4. The power supply VSETH is also connected to the source of the transistor QP2, and the source of the transistor QN4 is grounded. The drains of the transistors QP2 and QN4 are connected to the main word line MWLbx.

[Configuration of Write Drive Line Driver 12]

Figure 8:
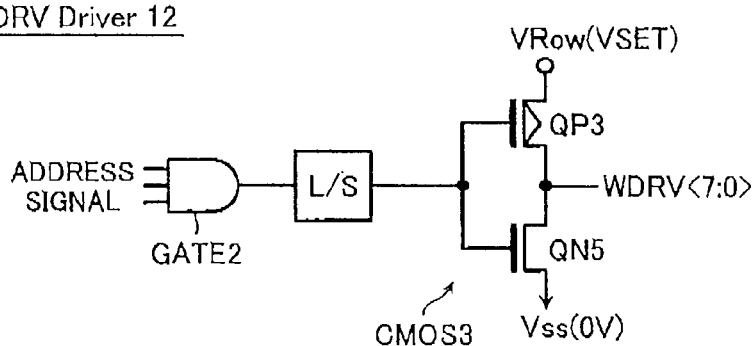
FIG. 8 is a circuit diagram illustrating an example configuration of the row control circuit of the resistive memory device according to the first embodiment.

As illustrated in FIGS. 5 and 8, the row power supply line VRow and the address signal line are connected to the write drive line driver 12. At this point, the write drive line driver 12 is also a pre-decoder.

The address signal line connected to the write drive line driver 12 is connected to a logic gate GATE2. An output signal of the logic gate GATE2 is supplied to an input terminal of a CMOS inverter CMOS3 through a level shifter L/S. The CMOS inverter CMOS3 includes a PMOS transistor QP3 and an NMOS transistor QN5. The row power supply line VRow to which the voltage VSET is applied as described later is connected to the source of the transistor QP3, and the source of the transistor QN5 is grounded. The drains of the transistors QP3 and QN5 are connected to the write drive lines WDRV<7:0>.

[Configuration of Row Power Supply Line Driver 13]

Figure 9:
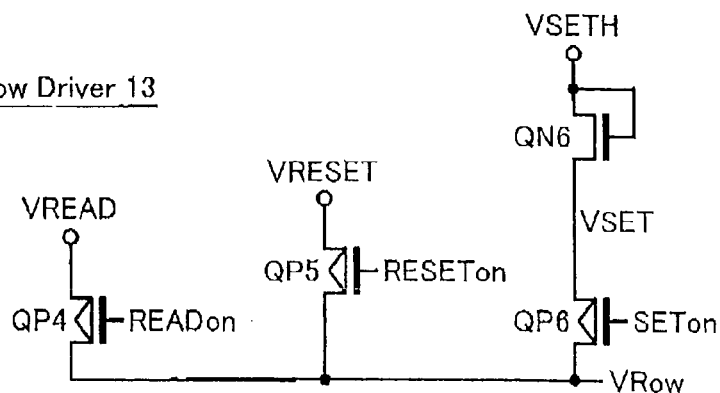
FIG. 9 is a circuit diagram illustrating an example configuration of the row control circuit of the resistive memory device according to the first embodiment.

As illustrated in FIGS. 5 and 9, the row power supply line VRow and a control signal line are connected to the row power supply line driver 13. In the row power supply line driver 13, the power supply VREAD is connected to the row power supply line VRow through a PMOS transistor QP4, and the power supply VRESET is connected to the row power supply line VRow through a PMOS transistor QP5. A control signal READon is supplied to the gate of the transistor QP4, and a control signal RESETon is supplied to the gate of the transistor QP5. The control signals READon and RESETon are changed from the "H" state to the "L" state in reading the data and in the reset operation, respectively.

In addition, the power supply VSETH is connected to the row power supply line driver 13. The power supply VSETH is connected to the drain and gate of the NMOS transistor QN6. The source of the transistor QN6 is connected to a source of a PMOS transistor QP6. The drain of the PMOS transistor QP6 is connected to the row power supply line VRow. A control signal SETon is supplied to the gate of the transistor QP6.

A detailed configuration of the column control circuit will be described with reference to FIGS. 10 to 13. FIGS. 10 to 13 are circuit diagrams illustrating an example of the configuration of the column control circuit in the resistive memory device.

[Configuration of Column Switch 20]

Figure 10:
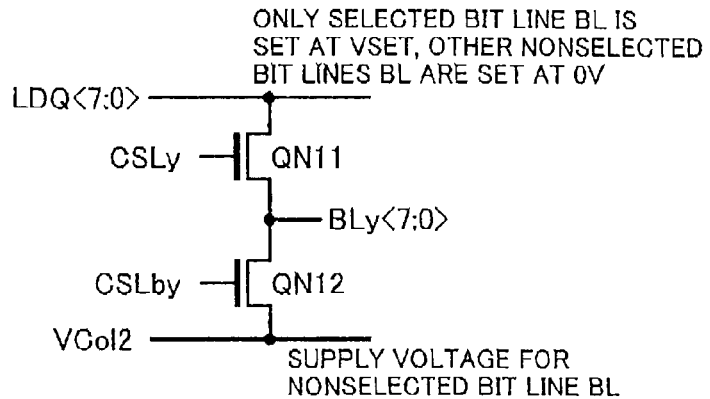
FIG. 10 is a circuit diagram illustrating an example configuration of the column control circuit of the resistive memory device according to the first embodiment.

As illustrated in FIGS. 5 and 10, one of 64 pairs of the column selection lines CSLy and CSLby(y=63:0>), the column power supply line Vcol2 and the local data lines LDQ<7:0> are connected to the column switch 20. In addition, the bit lines BLy<7:0> are connected to the column switch 20. The bit lines BLy<7:0> are each connected to the plural memory cells MC that are arranged in line.

As described above, the bit lines BLy<7:0> connected to one column switch 20 includes the eight wirings, i.e., the bit lines BLy0 to BLy7. Similarly, the local data lines LDQ<7:0> include the eight wirings, local data lines LDQ0 to LDQ7.

As illustrated in FIG. 10, the column switch 20 has eight transistor pairs each including two NMOS transistors QN11 and QN12 connected to each other at their sources. The column selection line CSLy is connected to the gate of the transistor QN11, and one of the local data lines LDQ<7:0> is connected to the drain of the transistor QN11. In addition, The column selection line CSLby is connected to the gate of the transistor QN12, and the column power source line Vcol2 is connected to the drain of the transistor QN12. Furthermore, the sources of the transistors QN11 and QN12 are connected to one of the bit lines BLy<7:0>.

[Configuration of Column Decoder 21]

Figure 11:
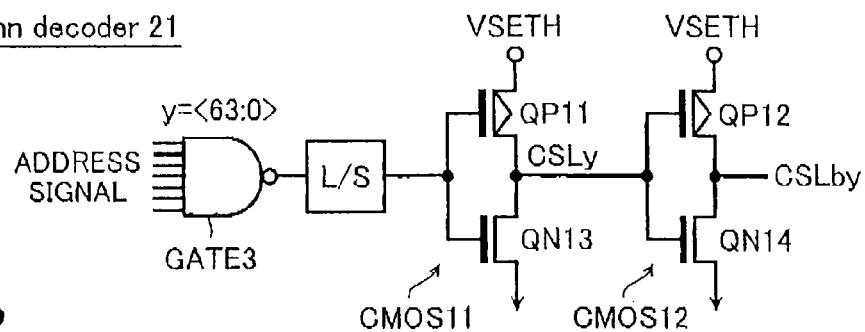
FIG. 11 is a circuit diagram illustrating an example configuration of the column control circuit of the resistive memory device according to the first embodiment.

As illustrated in FIGS. 5 and 11, 64 pairs of column selection lines CSLy and CSLby(y=<63:0>) and the address signal line are connected to the column decoder 21. In the resistive memory device of the embodiment, one pair of column selection lines CSLy and CSLby is connected to one of eight transistors (QN11 and QN12 of FIG. 10) in one column switch 20, and one column switch 20 selectively drives one of the eight bit lines<7:0>.

The column decoder 21 includes a circuit of FIG. 11 for each pair of column selection lines CSLy and CSLby. As illustrated in FIG. 11, in one column decoder 21, the address signal lines connected to the column decoder 21 are connected to a logic gate GATES. An output signal of the logic gate GATE3 is supplied to an input terminal of a CMOS inverter CMOS11 through a level shifter L/S. The CMOS inverter CMOS11 includes a PMOS transistor QP11 and an NMOS transistor QN13. The power supply VSETH is connected to the source of the transistor QP11 and the source of the transistor QN13 is grounded. The drains of the transistors QP11 and QN13 are connected to the column selection line CSLy.

In addition, the column selection line CSLy is connected to a CMOS inverter CMOS12. The CMOS inverter CMOS12 includes a PMOS transistor QP12 and an NMOS transistor QN14. The power supply VSETH is connected to the source of the transistor QP12 and the source of the transistor QN14 is grounded. The drains of the transistors QP12 and QN14 are connected to the column selection line CSLby.

[Configuration of Sense Amplifier/Write Buffer 22]

Figure 12:
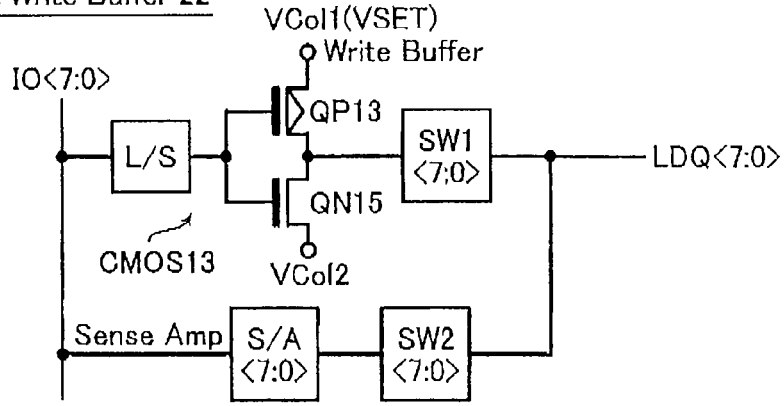
FIG. 12 is a circuit diagram illustrating an example configuration of the column control circuit of the resistive memory device according to the first embodiment.

As illustrated in FIGS. 5 and 12, the column power supply line VCol1, the local data lines LDQ<7:0>, and the data input and output lines 10<7:0> are connected to the sense amplifier/write buffer 22. A configuration of the write buffer portion will be described below. The data input and output lines 10<7:0> connected to the sense amplifier/write buffer 22 are connected to a CMOS inverter CMOS13 through a level shifter L/S. The CMOS inverter CMOS13 includes a PMOS transistor QP13 and an NMOS transistor QN15. The column power supply line VCol1 is connected to the source of the transistor QP13. The set voltage VSET is applied to the column power supply line VCol1 as described later. The source of the transistor QN15 is grounded. The drains of the transistors QP13 and QN15 are connected to the local data lines LDQ<7:0> through a switch SW1.

Then a sense amplifier portion will be described below. The data input and output lines 10<7:0> connected to the sense amplifier/write buffer 22 are connected to a sense amplifier S/A. A various type of sense amplifier may be used as the sense amplifier S/A, such as single end type, differential type using a reference cell, and so on. An output terminal of the sense amplifier S/A is connected to the local data lines LDQ<7:0> through a switch SW2.

[Configuration of Column Power Supply Line Driver 23]

Figure 13:
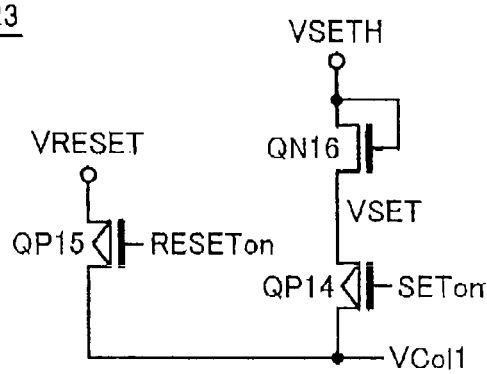
FIG. 13 is a circuit diagram illustrating an example configuration of the column control circuit of the resistive memory device according to the first embodiment.

As illustrated in FIGS. 5 and 13, the column power supply line VCol1 and the control signal line are connected to the column power supply line driver 23. In the column power supply line driver 23, the power supply VRESET is connected to the column power supply line VCol1 through a PMOS transistor QP15. The control signal RESETon is supplied to the gate of the transistor QP15. In addition, the power supply VSETH is connected to a drain and a gate of an NMOS transistor QN16, and a source of the transistor QN16 is connected to the column power supply line VCol1 through a PMOS transistor QP14. The control signal SETon is supplied to the gate of the transistor QP14.

Set operations in the resistive memory device so configured will now be described below. First, the operation of the row control circuit in the resistive memory device in the set operation for a selected memory cell array MA will be described below. As illustrated in FIG. 5, the word lines WL have a hierarchical structure. The word lines WLx<7:0> selectively driven by the main row decoder 11 and the row decoder 10 are provided with voltages applied to the write drive lines WDRV<7:0> or the row power supply line VRow. Firstly, the operation for applying voltages to the write drive lines WDRV<7:0> and the row power supply line VRow that are connected to the row decoder 10 will be described below.

[Operation of Row Power Supply Line Driver 13]

In the set operation, at the row power supply line driver 13, the control signal (SETon signal) that has been supplied to the gate of the transistor QP6 becomes the "L" state and the transistor QP6 becomes conductive. The voltage VSETH of the power supply VSETH is transferred by the NMOS transistor QN6, and becomes the voltage VSET. The row power supply line driver 13 drives the row power supply line VRow to the voltage VSET in the set operation.

[Operation of Write Drive Line Driver 12]

A write drive line driver 12 has a logic gate GATE2 to which an address signal is input. Based on the address signal, the logic gate GATE2 supplies to the input terminal of the CMOS inverter CMOS3 an "H" signal for one of the write drive lines (e.g., WDRV1) that corresponds to the address signal, and an "L" signal for every other write drive lines that do not correspond to the address signal. For a write drive line (e.g., WDRV1) that corresponds to the address signal, an "H" signal is supplied to the input terminal of the CMOS inverter CMOS3, and a ground voltage Vss (e.g., 0V) is applied to the write drive line WDRV1 via the conducting transistor QN5. For every other write drive line that does not correspond to the address signal, an "L" signal is supplied to the input terminal of the CMOS inverter CMOS3, and the voltage of the row power supply line VRow (VSET) is applied to the write drive lines WDRV via the conducting transistor QP3.

Next, how the main word lines MWLx, MWLbx and the word lines WLx<7:0> are selectively driven by the main row decoder 11 and the row decoder 10 will be described below.

[Operation of Main Row Decoder 11]

An address signal is also supplied to the input terminal of a logic gate GATE1 in the main row decoder 11. Based on the address signal, the logic gate GATE1 supplies to the input terminal of a CMOS inverter CMOS1 an "L" signal for the selected x (e.g., x=0) of x=<255:0>, and an "H" signal for every non-selected x. Firstly, description is made on the selected x (e.g., x=0). For the selected x (e.g., x=0), an "L" signal is supplied to the input terminal of the CMOS inverter CMOS1, and an "H" signal of the power supply VSETH is supplied to a main word line MWL0 via the conducting transistor QP1. In addition, the "H" signal of the main word line MWL0 is supplied to the input terminal of a CMOS inverter CMOS2, and the "L" signal at ground voltage Vss is supplied to a main word line MWLb0 via the conducting transistor QN4. That is, for the selected x (e.g., x=0), an "H" signal is supplied to the main word line MWL0, while an "L" signal is supplied to the main word line MWLb0.

Secondly, description is made on the non-selected x. For each non-selected x, an "H" signal is supplied to the input terminal of a CMOS inverter CMOS1, and an "L" signal at ground voltage Vss is supplied to a main word line MWLx via the conducting transistor QN3. In addition, the "L" signal of the main word line MWLx is supplied to the input terminal of a CMOS inverter CMOS2, and the "H" signal of the power supply VSETH is supplied to a main word line MWLbx via the conducting transistor QP2. That is, for each non-selected x, an "L" signal is supplied to a respective main word line MWLx, while an "H" signal is supplied to a respective main word line MWLbx.

[Operation of Row Decoder 10]

The row decoder 10 applies the voltage of the row power supply line VRow or the write drive lines WDRV to the corresponding word lines WL based on the signals supplied to the main word lines MWLx and MWLbx. For the selected x (e.g., x=0), an "H" signal is supplied to the main word line MWL0 and an "L" signal is supplied to the main word line MWLb0. Since an "L" signal is supplied to the gate of the transistor QN1 and an "H" signal is supplied to the gate of the transistor QN2 in the row decoder 10, the voltage of the write drive lines WDRV<7:0> is applied to the word lines group WL0<7:0> via the conducting transistor QN2. In this case, a ground voltage (e.g., 0 V) is applied to a write drive line (e.g., WDRV1) that corresponds to the address signal, and the voltage of the row power supply line VRow (e.g., VSET) is applied to the other write drive lines that do not correspond to the address signal. The ground voltage (e.g., 0 V) is only applied to one of the word lines WL01 among the word lines WL0<7:0> that corresponds to the address signal, while the voltage VSET is applied to the other word lines WL.

In addition, for each non-selected x, an "L" signal is supplied to a main word line MWLx and an "H" signal is supplied to a main word line MWLbx. Since an "H" signal is supplied to the gate of the transistor QN1 and an "L" signal is supplied to the gate of the transistor QN2 in the row decoder 10, the voltage of the row power supply line VRow (VSET) is applied to the word lines WLx<7:0> via the conducting transistor QN1. As a result, in the set operation, the ground voltage (0 V) is only applied to one of the word lines WL01 that is selected by the address signal, while the voltage of the row power supply line VRow (VSET) is applied to every other word lines WL.

Referring now to FIG. 5 and FIGS. 10 to 13, the operation of the column control circuit in the resistive memory device in the set operation will be described below. The voltage applied to the local data lines LDQ<7:0> and the column power supply line VCol2 is applied to the bit lines BLy<7:0> that are selectively driven by the column decoder 21 and the column switch 20. Firstly, the operation for applying the voltage to the local data lines LDQ<7:0> that are corrected to the column switches 20 as well as to the column power supply lines VCol1 and VCol2 will be described below.

[Operation of Column Power Supply Line Driver 23]

In the set operation, at the column power supply line driver 23, a control signal (SETon signal) that has been supplied to the gate of a transistor QP14 becomes the "L" state and the transistor QP14 becomes conductive. The voltage VSETH of the power supply VSETH transferred by the NMOS transistor QN16 becomes the voltage VSET. The column power supply line driver 23 drives the column power supply line VCol1 to the voltage VSET.

[Operation of Sense Amplifier/Write Buffer 22]

In the set operation, at the sense amplifier/write buffer 22, the switches SW1 of the write buffer part turn on and become conductive, while the switches SW2 of the sense amplifier part turn off and become non-conductive. Write data is supplied to the sense amplifier/write buffer 22 from data input/output lines 10<7:0>. The write data is supplied to the input terminal of a CMOS inverter CMOS13 via a level shifter L/S. In response to this data, the local data lines LDQ<7:0> is provided with the voltage VSET or the ground voltage (Vss=0V) applied thereto.

Secondly, how column selection lines CSLy and the bit lines BLy<7:0> are selectively driven by the column decoder 21 and the column switch 20 will be described below.

[Operation of Column Decoder 21]

An address signal is supplied to the input terminal of a logic gate GATE3 in the column decoder 21. Based on the address signal, the logic gate GATE3 supplies to the input terminal of the CMOS inverter CMOS11 an "L" signal for each y (e.g., y=0) selected from y-<63:0>, and an "H" signal for each non-selected y. Firstly, description is made on the selected y (e.g., y=0). For each selected y (e.g., y=0), an "L" signal is supplied to the input terminal of the CMOS inverter CMOS11, and an "H" signal of the power supply VSETH is supplied to each of column selection lines CSL0 via the conducting transistor QP11. In addition, an "H" signal of the column selection line CSL0 is supplied to the input terminal of the CMOS inverter CMOS2, and an "L" signal of the ground voltage Vss is supplied to the column selection line CSLb0 via the conducting transistor QN14. That is, on the selected y (e.g., y=0), the column selection line CSL0 is provided with an "H" signal, while the column selection line CSLb0 is provided with an "L" signal.

Secondly, description is made on the non-selected y. For each non-selected y, an "H" signal is supplied to the input terminal of the CMOS inverter CMOS11, and an "L" signal at ground voltage Vss is supplied to the column selection line CSLy via the conducting transistor QN13.

In addition, an "L" signal of the column selection line CSLy is supplied to the input terminal of the CMOS inverter CMOS12, and an "H" signal of the power supply VSETH is supplied to the column selection line CSLby via the conducting transistor QN12. That is, on the non-selected y, the column selection line CSLy is provided with an "L" signal, while the column selection line CSLby is provided with an "H" signal.

[Operation of Column Switch 20]

The column switch 20 applies the voltage of the column power supply line VCol2 or the local data lines LDQ to the bit lines BL based on the signals supplied to the column selection lines CSLy and CSLby. For the selected y (e.g., y=0), an "H" signal is supplied to the column selection line CSL0, while an "L" signal is supplied to the column selection line CSLb0. An "H" signal is supplied to the gate of the transistor QN11 in the column switch 20, while an "L" signal is supplied to the gate of the transistor QN12 in the column switch 20. Accordingly, the voltage of the local data lines LDQ<7:0> is applied to the bit line BL0<7:0> via the conducting transistor QN12.

The voltage (VSET) of the column power supply line VCol1 is applied to the local data line (e.g., LDQ1) which corresponds to the address signal, and the ground voltage Vss (=0V) is applied to the other local data lines which do not correspond to the address signal. In the bit lines BL0<7:0>, the voltage (VSET) of the column power supply line VCol1 is applied only to the bit line BL01 which corresponds to the address signal and the ground voltage Vss (=0V) is applied to the other bit lines BL.

On the other hand, for each non-selected y, an "L" signal is supplied to the column selection line CSLy, while an "H" signal is supplied to the column selection line CSLby. An "L" signal is supplied to the gate of the transistor QN11, while an "H" signal is supplied to the gate of the transistor QN12 in the column switch 20. As a result, in the set operation, the voltage of the column power supply line VCol1 (VSET) is applied only to the bit line BL01 selected by the address signal, and the voltage of the column power signal line VCol2 (0 V) is applied to the other non-selected bit lines BL.

As described above, in the selected memory cell array MA (in this case, description is made assuming that the memory cell array MA3 is selected), the voltage VSET is applied only to one bit line selected from among the plural bit lines BL, and a voltage of 0 V is applied to the other bit lines. On the other hand, a voltage of 0 V is applied only to one word line WL selected from among the plural word lines WL, and the voltage VSET is applied to the other word lines.

The resistive memory device according to this embodiment shares bit lines BL and word lines WL among the laminated plural memory cell arrays MA. In this case, bit lines BL and word lines WL in the non-selected memory cell array MA need to be provided with voltages that do not cause erroneous data write or the like. On the other hand, there is a need to restrain leak currents caused by the application of these voltages as low as possible.

Figure 14:
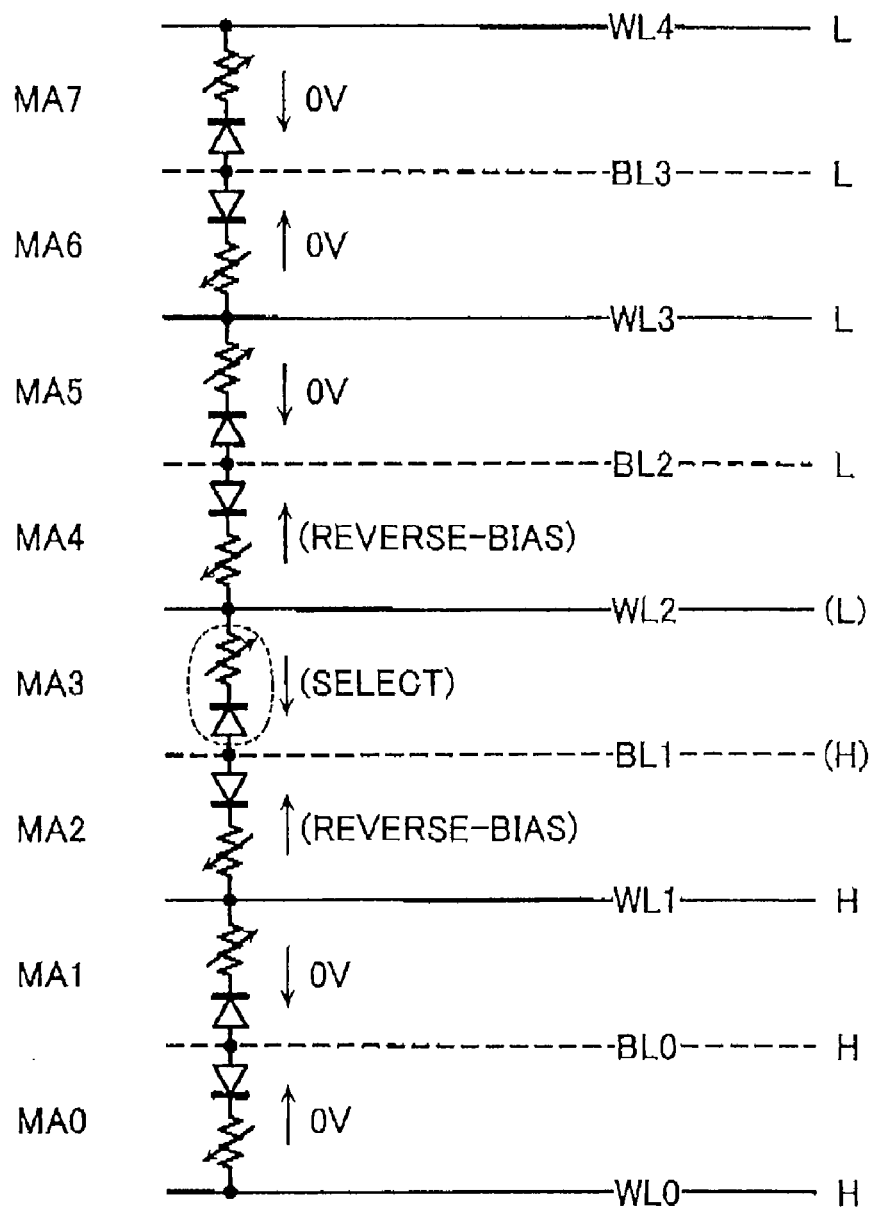
FIG. 14 is a schematic diagram that illustrates voltages applied to the bit lines BL and the word lines WL in the non-selected memory cell array MA in the first embodiment.

Accordingly, this embodiment applies voltages as shown in FIG. 14 to bit lines BL and word lines WL arranged in the non-selected memory cell arrays MA, thereby minimizing leak currents.

FIG. 14 illustrates voltages applied to word lines WL and bit lines BL arranged in each of the memory cell arrays MA0-7, using reference signs "H", "(H)", "L", and "(L)", as well as how voltages are applied to each of the memory cell arrays MA0-7.

A reference sign "H" shows that voltages of all the word lines WL or voltages of all the bit lines BL arranged in a certain memory cell array MA are set to "H" (VSET).

A reference sign "L" shows that voltages of all the word lines WL or voltages of all the bit lines BL arranged in a certain memory cell array MA are set to "L" (0 V).

A reference sign "(H)" (with brackets) shows that only a voltage of the word line WL or the bit line BL selected from among the plural word lines WL or the plural bit lines BL arranged in a certain memory cell array MA is set to "H" (VSET), and the other word lines or the other bit lines are set to "L" (0 V).

A reference sign "(L)" (with brackets) shows that only a voltage of the word line WL or the bit line BL selected from among the plural word lines WL or the plural bit lines BL arranged in a certain memory cell array MA is set to "L" (0V), and the other word lines or the other bit lines are set to "H" (VSET).

As an example, when the memory cell array MA3 is selected, the voltage of the bit lines BL1 arranged in the memory cell array MA3 is in the "(H)" state, while the word lines WL2 is in the "(L)" state. In this case, this embodiment sets all of the word lines WL and all of the bit lines BL arranged in the non-selected memory cell array MA2 that shares the bit lines BL1 with the memory cell array M3, as well as in the non-selected memory cell arrays MA (MA1, MA0) that are located more distant from the memory cell array MA3 than the memory cell array MA2, to the "H" state (see FIG. 14).

On the other hand, this embodiment sets all of the word lines WL and all of the bit lines BL arranged in the non-selected memory cell array MA4 that shares the word lines WL2 with the memory cell array M3, as well as in the non-selected memory cell arrays MA (MA5-MA7) that are located more distant from the memory cell array MA3 than the memory cell array MA4, to the "L" state (see FIG. 14).

When such voltages are applied to the word lines WL and the bit lines BL in the non-selected memory cell arrays MA0-2 and MA4-7, a reverse bias voltage is applied to the memory cells MC in the memory cell arrays MA2 and MA4 that are adjacent to the selected memory cell array MA3. In contrast, the reverse bias voltage is not applied to the memory cell MC in the other memory cell arrays MA0, MA1, MA5, MA6, and MA7 (0V). Therefore increase in power consumption caused by a leak current or the like can be minimized.

Figure 15:
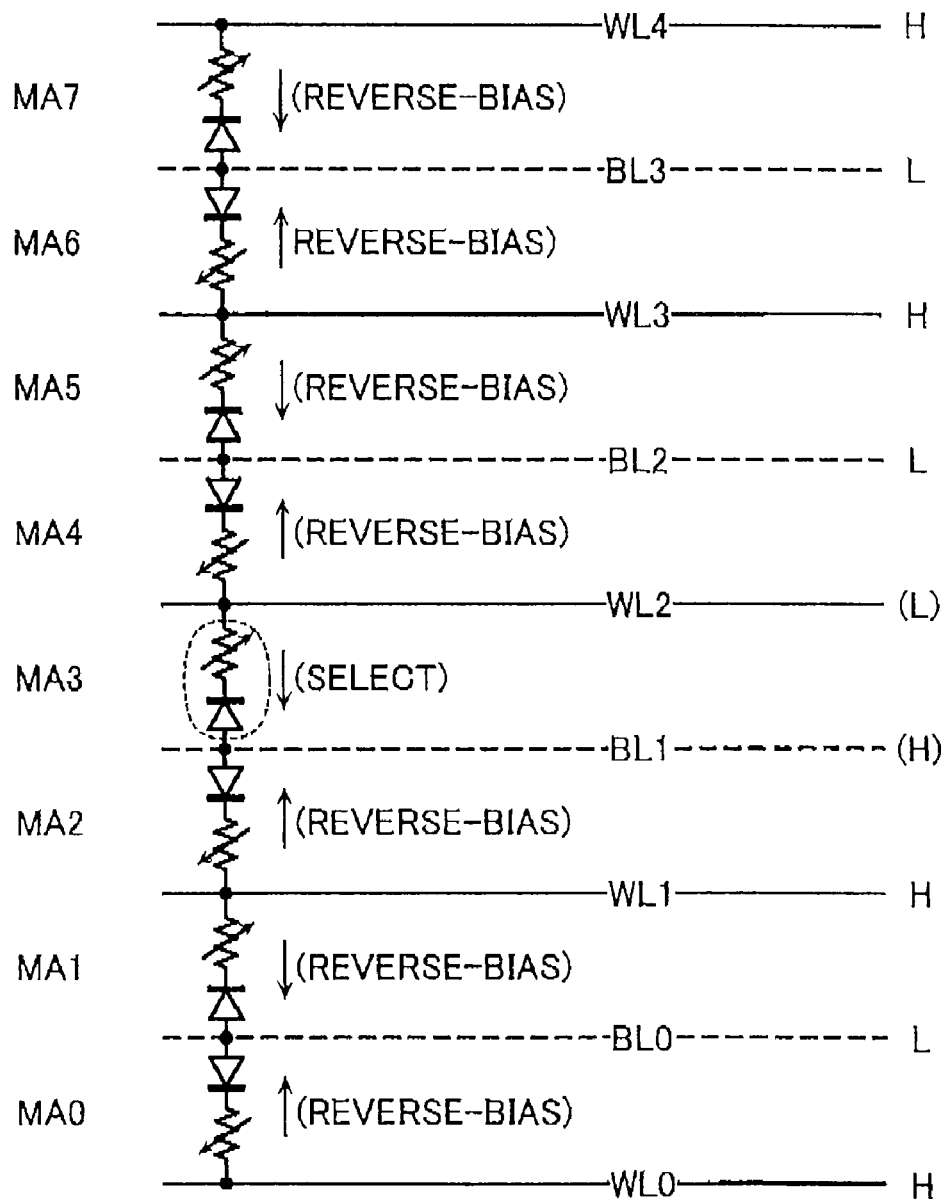
FIG. 15 is a schematic diagram that illustrates voltages applied to the bit lines BL and the word lines WL in the non-selected memory cell array MA in the comparative example of the first embodiment.

Then, a comparative example is explained with reference to FIG. 15. This comparative example is the case in which the voltage of all the word lines WL arranged in the non-selected memory cell arrays MA0-2 and MA4-7 is set to "H", and the voltage of all the bit lines BL arranged in the non-selected memory cell arrays MA0-2 and MA4-7 is set to "L". In this case, the forward-bias voltage is prevented from being applied to memory cells in the non-selected memory cell arrays MA, thus avoiding erroneous writing or the like. On the other hand, reverse-biased voltage is applied to most of the memory cells formed therein. Accordingly, it may increase power consumption caused by the increase of the leak current.

In contrast, power consumption is largely reduced in this embodiment, because the reverse-biased voltage is applied only to the memory cell arrays MA2 and MA4 that are adjacent to the selected memory cell array MA3.

Figure 16:
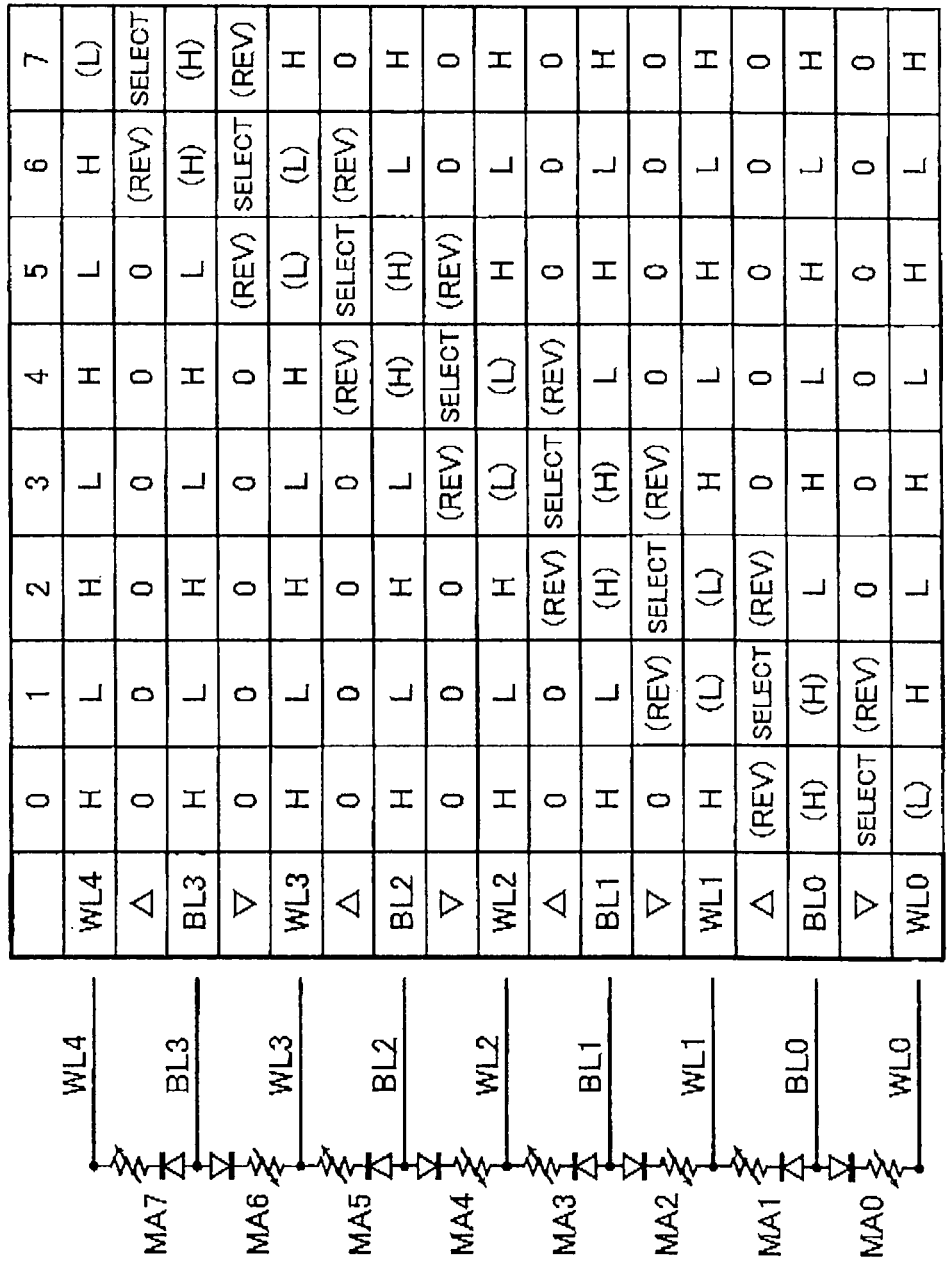
FIG. 16 is a schematic diagram that illustrates voltages applied to the bit lines BL and the word lines WL in the non-selected memory cell array MA in the first embodiment.

With reference to FIG. 16, a sequence of the write operation (the set operation) in the resistive memory device according to this embodiment is described hereinbelow. As shown in FIG. 16, in this embodiment, after performing writing in the memory cell array MAi, writing to the memory cell array MAi+1 adjacent to the memory cell array MAi is performed by way of example. Then, a write operation is sequentially performed in the adjacent memory cell array MAi+2, MAi+3, MSi+4 . . . formed above the memory cell array MAi+1, in this order.

When a memory cell array MA subject to a write operation is changed after completing the writing operation in the memory cell array MAi, the voltages of the word lines WL and the bit lines BL in the memory cell array MAi do not change greatly. Likewise, when a memory cell array MA subject to a write operation is changed, the voltages of the word lines WL and the bit lines BL in the memory cell array MAi+1 to be written in the next step do not change greatly. For example, they changes from the "(L)" state to the "(H)" state. Or a voltage of only one bit line BL or only one word line WL included in the plural bit lines or the word lines changes.

In contrast, in other memory cell arrays MA except the memory cell arrays MAi and MAi+1, the voltages of the word lines WL or the bit lines BL greatly change between the "H" state and the "L" state.

Second Embodiment

Next, a second embodiment of the present invention is described with reference to FIG. 17. In the second embodiment, a structure of the memory device is the same as that of the first embodiment. The second embodiment is different from the first embodiment only in an operation when a selected memory cell array MA is switched. That is, as shown in FIG. 17, the second embodiment is different in that, when data write in one memory cell array MAi is finished, a memory cell array MAi+2 is selected in the next step, without selecting the adjacent memory cell array MAi+1 but skipping it.

When an adjacent memory cell array MAi+1 is selected sequentially after an operation in the memory cell array MAi is finished like in the first embodiment, word lines WL and bit lines BL arranged in the already-written memory cell array MAi as well as in non-selected memory cell arrays MA except the memory cell array MAi+1 are repeatedly switched between the "H" state and the "L" state. When such switching is repeated, charging and discharging in parasitic capacitance in the wirings is repeated, thus leading to reduced operation speed and increased power consumption.

Figure 17:
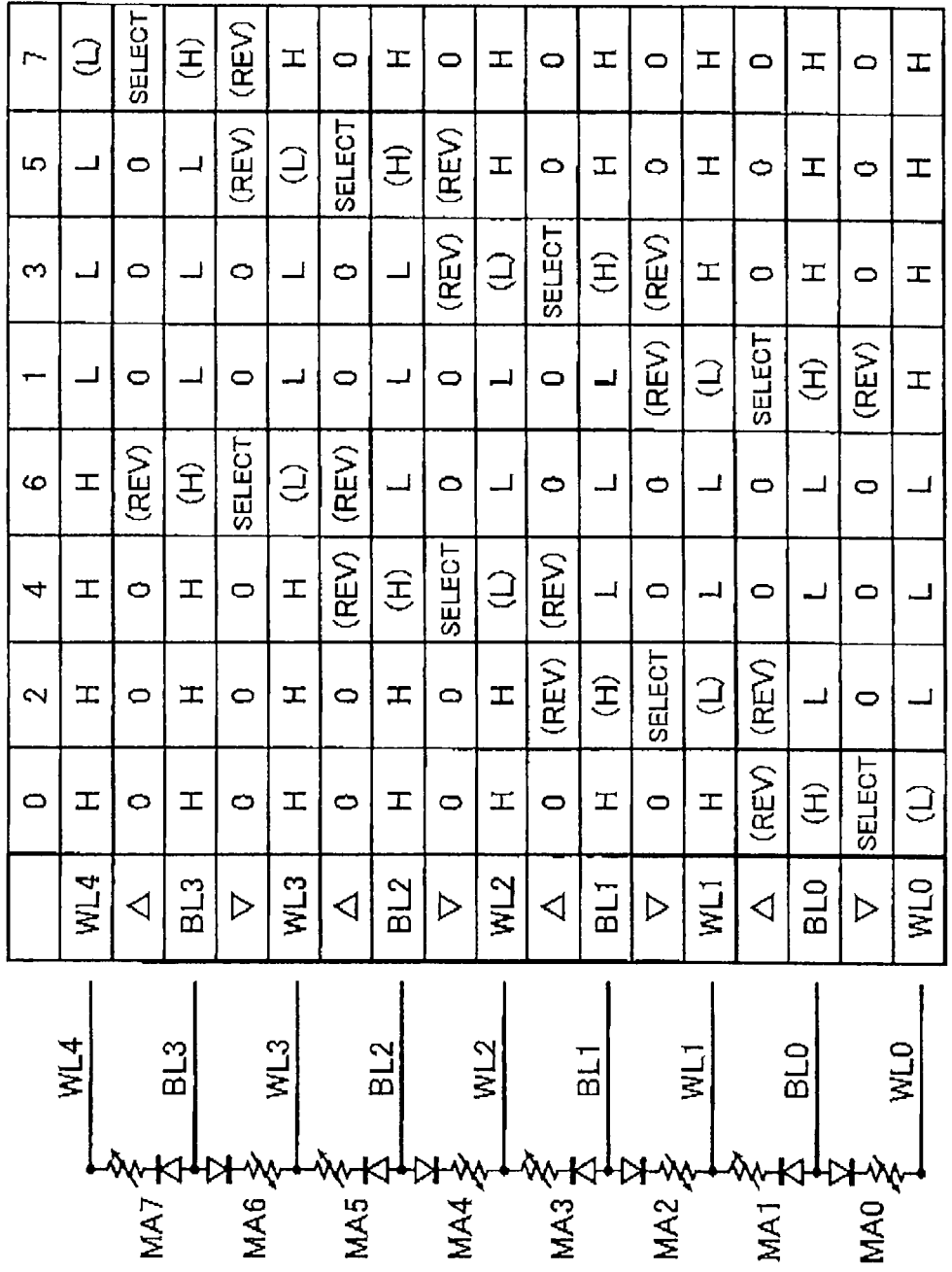
FIG. 17 is a schematic diagram that illustrates voltages applied to the bit lines BL and the word lines WL in the non-selected memory cell array MA in a second embodiment of the present invention.

On the other hand, on selecting a memory cell array MA, if one memory cell array adjacent to the currently-selected memory cell array is skipped like in the second embodiment, the number of times of switching between the "H" state and the "L" state becomes small in the bit lines BL and the word lines WL in the non-selected memory cell arrays MA, as shown in FIG. 17. Thus, the second embodiment may enjoy improvement in the operation speed and reduction in power consumption in comparison with the first embodiment.

Third Embodiment

Then, a third embodiment of the present invention is described with reference to FIG. 18. The third embodiment is different from the first embodiment in voltages to be applied to non-selected word lines WL and non-selected bit lines BL in the selected memory cell array MA. That is, when a memory cell MC11 is selected to perform a set operation therein in the third embodiment, a small positive-bias voltage Vα is applied to non-selected bit lines BL00, BL02 and BL03 that are in the "L" state, while a selected bit line BL01 is driven from the "L" state (the voltage Vα) to the "H" state (in this embodiment, the voltage VSET).

Moreover, the voltage (VSET-Vα) smaller than the voltage VSET by the bias voltage Vα is applied to the non-selected word lines WL00, WL02 and WL03 that are in the "H" state. In contrast, the selected word line WL01 to be set to the "L" state is driven from the "H" state (the voltage VSET-Vα) to the "L" state (e.g., the voltage Vss=0 V).

In this embodiment, a small reverse-biased voltage Vα is applied to memory cells MC that are in an half-selection state. However, the reverse-biased voltage applied to the non-selected memory cells MC is VSET-2Vα, not the voltage VSET. Accordingly, the third embodiment may restrict a leak current in comparison with the first embodiment.

Figure 18:
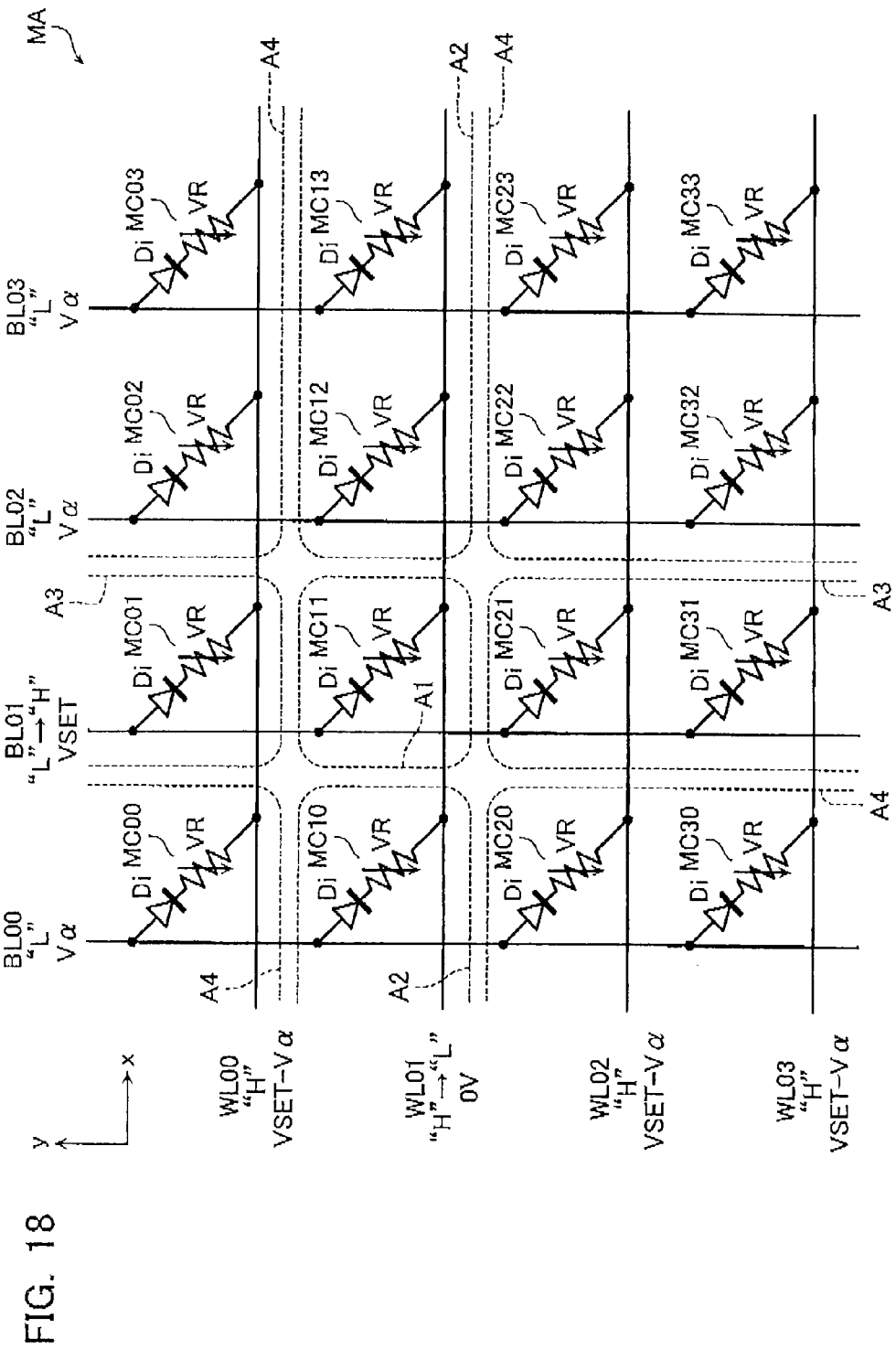
FIG. 18 is a schematic diagram that illustrates a third embodiment of the present invention.

Although a case where the voltage Vα is applied to the non-selected bit lines BL while the voltage VSET-Vα is applied to the non-selected word lines WL is explained as an example in FIG. 18, the present invention is not limited to this. For example, the following voltages may be applied instead.

(1) While the voltage Vα is applied to the non-selected bit line BL, the voltage VSET is applied to the non-selected word lines WL.

(2) While a voltage of 0 V is applied to the non-select bit lines BL, the voltage VSET-Vα is applied to the non-selected word lines WL.

(3) While the voltage Vα is applied to the non-selected bit lines BL, a voltage VSET-Vβ is applied to the non-selected word lines WL (Vα≠Vβ).

Having explained the embodiments of the present invention, it is understood that the examples and embodiments described herein are for illustrative purpose only and that various modifications, changes, or additions will be suggested to one skilled in the art without departing from the scope of the present invention. For example, although in the above-described embodiment, the word line contacts and the bit line contacts are formed independently for the respective word lines and the respective bit lines, the present invention is not limited to this example. It is also possible to provide a switching circuit for changing voltages supplied to a word line and a bit line, thereby one bit line contact or one word line contact may be shared by a plurality of the word lines or the bit lines.

What is claimed is:

1. A semiconductor storage device comprising:
a semiconductor substrate;
a plurality of memory cell arrays laminated on the semiconductor substrate, each of the memory cell arrays including a plurality of first wirings and a plurality of second wirings formed to intersect with each other, and memory cells each arranged at respective intersections between the first wirings and the second wirings, each of the memory cells including a rectifier element and a variable resistance element connected in series; and a control circuit operative to selectively drive the first and second wirings, the first and second wirings being shared by two of the memory cell arrays located adjacent to each other in a lamination direction;

the control circuit being operative to provide, in a first memory cell array selected from among the plurality of the memory cell arrays, a first potential to a selected first wiring, a first standard potential that is lower than the first potential to a non-selected first wiring, a second potential that is lower than the first potential to a selected second wiring, and a second standard potential that is higher than the second potential to a non-selected second wiring, the control circuit being operative to provide, in a non-selected second memory cell array that shares the first wiring with the first memory cell array as well as in a non-selected third memory cell array located more distant from the first memory cell array than the second memory cell array, the first potential to all of the first wirings and all of the second wirings, and the control circuit being operative to provide, in a non-selected fourth memory cell array that shares the second wiring with the first memory cell array, as well as in a non-selected fifth memory cell array located more distant from the first memory cell array than the fourth memory cell array, the second potential to all of the first wirings and all of the second wirings.

2. The semiconductor storage device according to claim 1, wherein the memory cell arrays are selected in an order that skips a single memory cell array sandwiched between a previously-selected memory cell array and another memory cell array to be selected next.

3. The semiconductor storage device according to claim 1,
wherein a reverse bias voltage is applied to a memory cell in the second and fourth memory cell arrays, while the reverse bias voltage is not applied to any memory cells in the third and fifth memory cell arrays.

4. The semiconductor storage device according to claim 1, wherein the control circuit sets the first standard potential to a larger value than the second potential by a certain bias value, or sets the second standard potential to a smaller value than the first potential by a certain bias value.

5. The semiconductor storage device according to claim 4,
wherein the memory cell arrays are selected in an order that skips a single memory cell array sandwiched between a previously-selected memory cell array and another memory cell array to be selected next.

6. The semiconductor storage device according to claim 4,
wherein the variable resistance element changes from a high resistance state to a low resistance state caused by the first potential.

7. The semiconductor storage device according to claim 4,
wherein a reverse bias voltage is applied to a memory cell in the second and fourth memory cell arrays, while the reverse bias voltage is not applied to any memory cells in the third and fifth memory cell arrays.

8. The semiconductor storage device according to claim 4,
wherein the variable resistance element changes from a high resistance state to a low resistance state caused by the first potential.

9. The semiconductor storage device according to claim 1, wherein the plurality of the memory cell arrays are formed so as to be laminated on a semiconductor substrate, and
the first wiring is connected to a memory cell in a memory cell array formed above the first wiring, as well as to a memory cell in another memory cell array formed below the first wiring.

10. The semiconductor storage device according to claim 1, wherein the memory cell arrays are selected in an order that skips a single memory cell array sandwiched between a previously-selected memory cell array and another memory cell array to be selected next.

11. The semiconductor storage device according to claim 9,
wherein a reverse bias voltage is applied to a memory cell in the second and fourth memory cell arrays, while the reverse bias voltage is not applied to any memory cells in the third and fifth memory cell arrays.

12. The semiconductor storage device according to claim 9,
wherein the control circuit sets the first standard potential to a larger value than the second potential by a certain bias value, or sets the second standard potential to a smaller value than the first potential by a certain bias value.

13. The semiconductor storage device according to claim 12,
wherein the memory cell arrays are selected in an order that skips a single memory cell array sandwiched between a previously-selected memory cell array and another memory cell array to be selected next.

14. The semiconductor storage device according to claim 12,
wherein the variable resistance element changes from a high resistance state to a low resistance state caused by the first potential.

15. The semiconductor storage device according to claim 12,
wherein a reverse bias voltage is applied to a memory cell in the second and fourth memory cell arrays, while the reverse bias voltage is not applied to any memory cells in the third and fifth memory cell arrays.

16. The semiconductor storage device according to claim 12,
wherein the variable resistance element changes from a high resistance state to a low resistance state caused by the first potential.

* * * * *